(12) United States Patent  
Chen et al.

(10) Patent No.: US 6,555,747 B2  
(45) Date of Patent: Apr. 29, 2003

(54) COMPUTER ENCLOSURE INCORPORATING BEZEL

(75) Inventors: Yun Lung Chen, Taipei (TW); Jung Chi Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/004,331

(22) Filed: Nov. 1, 2001

(65) Prior Publication Data

US 2003/0019648 A1 Jan. 30, 2003

(30) Foreign Application Priority Data

Jul. 27, 2001 (TW) .......................................... 090212834

(51) Int. Cl.[7] ................................................. H05K 5/00
(52) U.S. Cl. ..................... 174/52.1; 361/683; 361/724; 312/223.2
(58) Field of Search .................. 174/52.1; 361/683, 361/724; 312/223.2

(56) References Cited

U.S. PATENT DOCUMENTS 5,975,659 A * 11/1999 Yang et al. .............. 312/223.2
6,157,532 A * 12/2000 Cook et al. .................. 361/681
6,234,593 B1 * 5/2001 Chen et al. ............... 312/223.2
6,288,333 B1 * 9/2001 Liu et al. .................... 174/52.1

* cited by examiner

Primary Examiner—Hung V. Ngo  
(74) Attorney, Agent, or Firm—Wei Te Chung

(57) ABSTRACT

A computer enclosure includes a cage (30) and a bezel (10). The cage includes a front plate (32) defining a plurality of locking openings (42) and locating holes (44), and a bottom plate (34) defining a pair of locking apertures (46). The bezel has a plurality of engaging hooks (12) engaging with the front plate in the corresponding locking openings, and locating posts (14) received in the corresponding locating holes. The bezel also has a pair of arcuate supporting feet (16). Each supporting foot includes a horizontal surface (18) abutting against a bottom surface of the bottom plate, and a catch (22) abutting against a top surface of the bottom plate near the corresponding locking aperture. When the bezel is attached to the cage, the supporting feet are elastically deformed to cause the bezel to be firmly attached to the front plate of the cage.

11 Claims, 3 Drawing Sheets

COMPUTER ENCLOSURE INCORPORATING BEZEL

BACKGROUND OF THE INVENTION

1. Field of the Invention

The present invention relates to computer enclosures, and particularly to computer enclosures having bezels readily and securely attached thereto.

2. Related Art

Modem-day personal computers often comprise a bezel attached to a computer cage with screws. An example of such attachment is disclosed in Taiwan Patent Application No. 77202169. A tool is needed when the bezel is attached to the cage or detached from the cage. This is unduly inconvenient and time-consuming.

Improved means for attaching bezels to cages have been developed. An example of such means is disclosed in Taiwan Patent Application No. 85202167. A computer cage comprises a pair of side walls. Each side wall defines a pair of openings. The bezel forms a pair of hooks on each of opposite sides thereof. The hooks of the bezel engage with the cage in the corresponding openings, thereby attaching the bezel to the cage. However, the hooks are formed only in the sides of the bezel. There is no engagement between the cage and top or bottom portions of the bezel. Therefore the bezel is not able to be precisely attached to the cage. Furthermore, particularly after repeated use, the hooks are prone to elastically deform and disengage from the openings. Thus the bezel cannot be securely attached to the cage.

SUMMARY OF THE INVENTION

Accordingly, an object of the present invention is to provide a computer enclosure which has a bezel precisely and securely attached thereto.

To achieve the above-mentioned object, a computer enclosure in accordance with the present invention comprises a cage and a bezel. The cage comprises a front plate and a bottom plate. The front plate defines a plurality of locating holes and locking openings. The bottom plate defines a pair of locking apertures. The bezel comprises a plurality of engaging hooks engaging with the front plate in the corresponding locking openings, and a plurality of locating posts received in the corresponding locating holes. The bezel also comprises a pair of arcuate supporting feet. Each supporting foot comprises a horizontal surface abutting against a bottom surface of the bottom plate, and a catch formed on the horizontal surface. The catches abut against a top surface of the bottom plate adjacent the corresponding locking apertures. When the bezel is attached to the cage, the supporting feet are elastically deformed to cause the bezel to be firmly attached to the front plate of the cage.

Other objects, advantages and novel features of the present invention will be drawn from the following detailed embodiment of the present invention with attached drawings, in which:

DESCRIPTION OF THE PREFERRED EMBODIMENT

Figure 1:
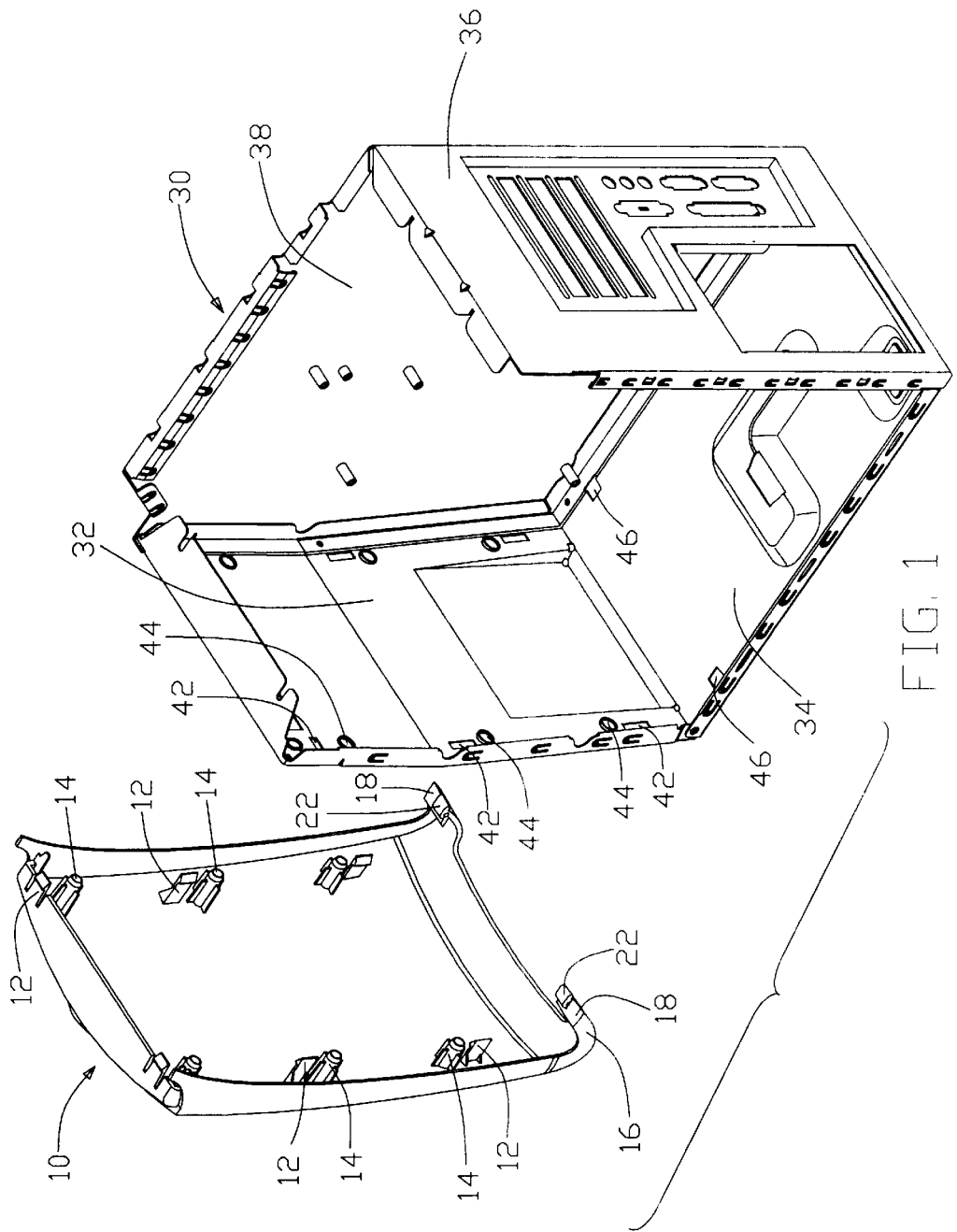
FIG. 1 is an exploded view of a computer enclosure of the present invention.

Referring to FIG. 1, a computer enclosure in accordance with the present invention comprises a bezel 10 and a cage 30.

The bezel 10 has a pair of horizontal engaging hooks. 12 extending inwardly from a top portion thereof. A pair of vertical engaging hooks 12 extends inwardly from each of opposite sides of an inner surface of the bezel 10. A locating post 14 adjacent to each hook 12 extends inwardly from the inner surface of the bezel 10. A pair of arcuate supporting feet 16 extends inwardly and upwardly from opposite sides of a bottom portion of the bezel 10 respectively. A horizontal surface 18 is formed on a distal end of each supporting foot 16. A catch 22 is formed on each horizontal surface 18.

The cage 30 comprises a front plate 32, a bottom plate 34, a rear plate 36, and a side plate 38 connected with the front plate 32 and the rear plate 36. A plurality of locking openings 42 is defined in the front plate 32, corresponding to the hooks 12 of the bezel 10. A plurality of locating holes 44 is defined in the front plate 32, corresponding to the locating posts 14 of the bezel 10. A pair of locking apertures 46 is defined in the bottom plate 34 proximate to the front plate 32, corresponding to the catches 22 of the bezel 10.

Figure 2:
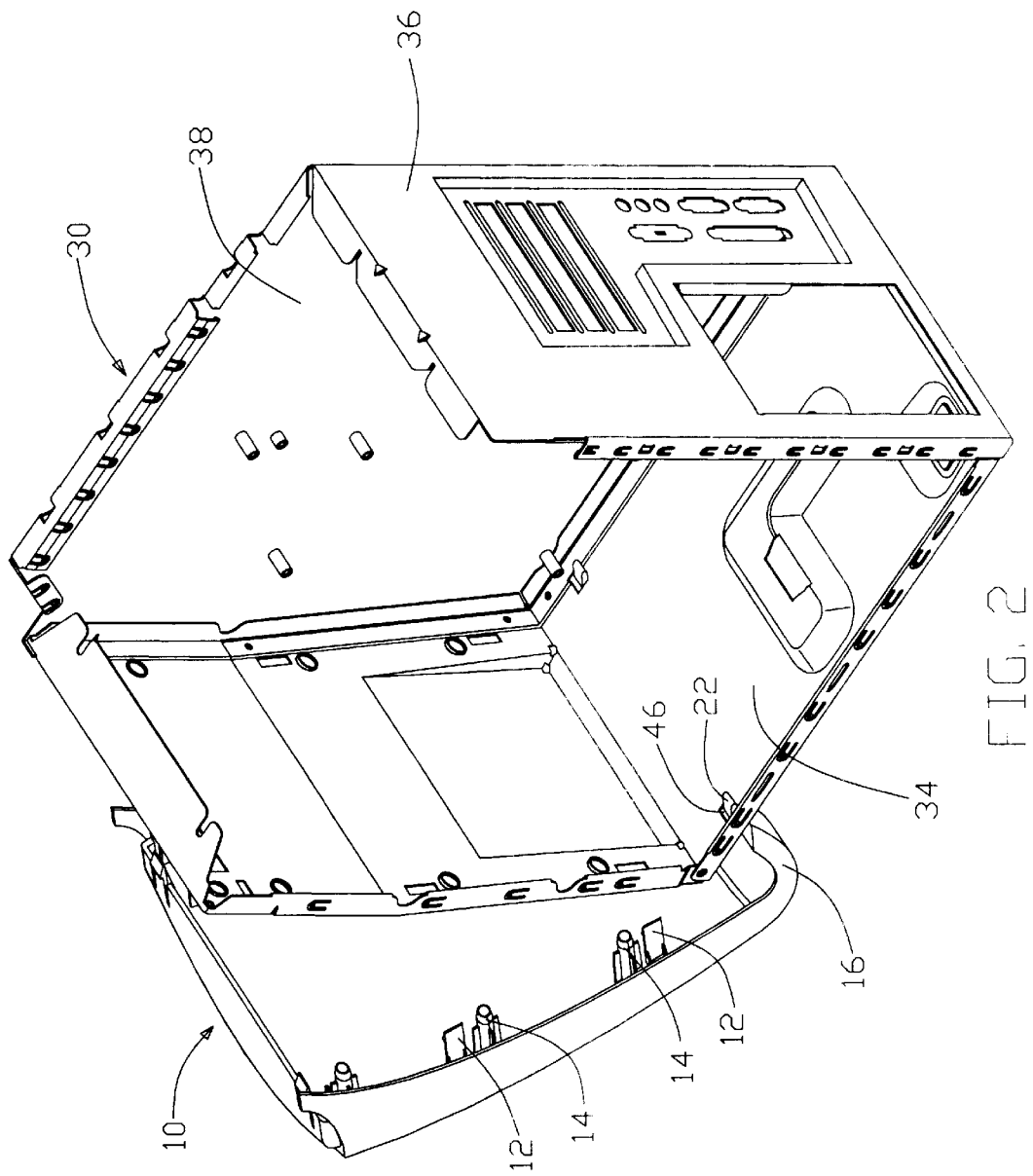
FIG. 2 is a view of FIG. 1 during assembly.
Figure 3:
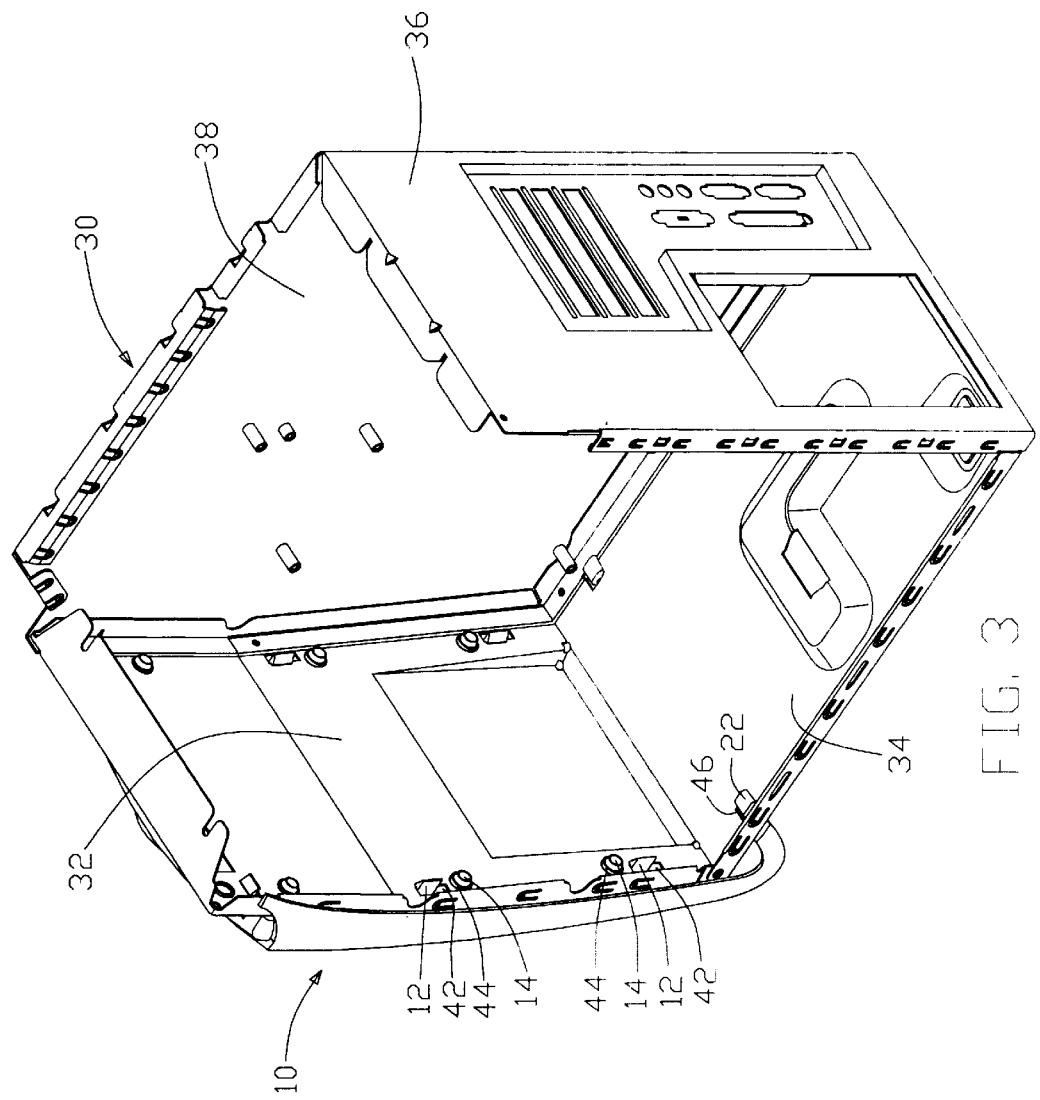
FIG. 3 is a fully assembled view of FIG. 1.

Referring also to FIGS. 2 and 3, in assembly, the catches 22 of the bezel 10 are inserted into the locking apertures 46 of the bottom plate 34 of the cage 30 from below the bottom plate 34. The bezel 10 is then rotated toward the cage 30 about the catches 22. The supporting feet 16 are thereby elastically deformed. The locating posts 14 are received in the corresponding locating holes 44 of the front plate 32 of the cage 30. The hooks 12 engage with the front plate 32 in the corresponding locking openings 42. At this time, the horizontal surfaces 18 of the supporting feet 16 abut against a bottom surface of the bottom plate 34. The catches 22 abut against a top surface of the bottom plate 34 at the locking apertures 46. The bezel 10 is thus firmly attached to the cage 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A computer enclosure comprising:
   a cage comprising a front plate and a bottom plate, the front plate defining a plurality of locking voids, the bottom plate defining at least one locking void; and
   a bezel attached to the cage, the bezel having a plurality of engaging members engaging with the front plate in corresponding locking voids, and at least one supporting member engaging with the bottom plate in the at least one locking void of the bottom plate.

2. The computer enclosure as claimed in claim 1, wherein the front plate further defines a plurality of locating voids and the bezel has a plurality of locating members received in corresponding locating voids to facilitate the bezel being precisely attached to the cage.

3. The computer enclosure as claimed in claim 2, wherein the at least one supporting member is arcuate and elastically deformable, whereby the bezel is firmly attached to the cage.

4. The computer enclosure as claimed in claim 3, wherein each supporting member has a generally horizontal surface abutting against a bottom surface of the bottom plate of the cage, and a catch abutting against a top surface of the bottom plate.

5. The computer enclosure as claimed in claim 4, wherein the plurality of engaging members comprises at least one engaging member extending inwardly from a top portion of the bezel, and at least one engaging member extending inwardly from each of opposite sides of an inner surface of the bezel.

6. The computer enclosure as claimed in claim 5, wherein each locating member is adjacent a corresponding engaging member.

7. The computer enclosure as claimed in claim 1, wherein the cage further comprises a rear plate generally opposite the front plate, and a side plate connected with the front plate and the rear plate.

8. A computer enclosure, comprising:

a cage comprising a vertical front plate and a horizontal bottom plate extending rearwardly from a bottom edge of the front plate, said bottom plate defining at least one locking void;

a bezel attached to the front plate, said bezel integrally forming at least one supporting member extending rearwardly from a bottom edge thereof, each supporting member having a horizontal surface abutting against a bottom surface of the bottom plate, and a catch extending through a corresponding locking void to abut against a top surface of the bottom plate.

9. The computer enclosure as claimed in claim 8, wherein the bezel has engaging members fixedly engaging with the front plate, and locating members fitting with the front plate.

10. The computer enclosure as claimed in claim 9, wherein each engaging member is accompanied by a corresponding locating member.

11. The computer enclosure as claimed in claim 8, wherein a pair of locking voids is defined in the bottom plate, and a pair of supporting members extends rearwardly from opposite ends of the bottom edge of the bezel.

* * * * *